United States Patent
Kobayashi

(10) Patent No.: US 6,271,696 B1
(45) Date of Patent: Aug. 7, 2001

(54) PHASE ADJUSTMENT CIRCUIT

(75) Inventor: Naoki Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/440,155

(22) Filed: Nov. 15, 1999

(30) Foreign Application Priority Data

Dec. 17, 1998 (JP) .................................................. 10-359588

(51) Int. Cl.⁷ ...................................................... H03K 5/13
(52) U.S. Cl. ............................ 327/144; 327/156; 327/244
(58) Field of Search .......................... 327/144, 145–150, 327/153, 156, 157, 158, 159, 161, 244, 245, 295, 296; 331/48, 49, 56

(56) References Cited

U.S. PATENT DOCUMENTS

| | | | |
|---|---|---|---|
| 5,150,068 | * 9/1992 | Kawashima et al. ................. | 327/145 |
| 5,574,756 | * 11/1996 | Jeong ..................................... | 375/376 |
| 6,052,007 | * 4/2000 | Ono ....................................... | 327/158 |

FOREIGN PATENT DOCUMENTS

| | | |
|---|---|---|
| 3-083415 | 4/1991 | (JP) . |
| 10-301663 | 11/1998 | (JP) . |

\* cited by examiner

*Primary Examiner*—Tuan T. Lam
(74) *Attorney, Agent, or Firm*—Sughrue, Mion, Zinn, Macpeak & Seas, PLLC

(57) ABSTRACT

A phase adjustment circuit of the present invention includes a plurality of input terminals which input a plurality of clock signals, respectively, and a plurality of first elements which input the clock signals, respectively, and adjust the clock signals, respectively. The phase adjustment circuit has a second element which compares the phase of a reference clock signal and the phase of an output signal from one of the first elements and outputs a compared result. A third element inputs the compared result and controls each of the first elements based on the compared result. Another phase adjustment circuit of the present invention includes a plurality of input terminals, which input a plurality of clock signals, respectively; a plurality of first elements, which input the clock signals, respectively, and oscillates the clock signals, respectively; and a second element which compares the phase of a reference clock signal and the phase of an output signal from one of the first elements and outputs a compared result. The first elements input the compared result and oscillate the clock signals, respectively, based on the compared result. A method of the present invention for adjusting the phase between a plurality of clock signals includes delaying each of the clock signals by a delay amount; comparing the phase of a reference clock signal and the phase of one of the delayed clock signals which is delayed during the delaying step; and controlling the delay amount based on the compared result which is compared during the comparing step.

11 Claims, 3 Drawing Sheets

PHASE ADJUSTMENT CIRCUIT

BACKGROUND OF THE INVENTION

The present invention relates to a phase adjustment circuit which adjusts delay dispersion that occurs during clock distribution in a logic IC and logic card.

In a conventional logic IC and logic card, a phase adjustment circuit which compares the phases of a reference clock signal supplied from an external device and the phase of a feedback clock signal which shows that delay occurs during internal clock distribution. The phase adjustment circuit controls delay time in the internal clock distribution based on the result of the comparison so that the phase of the feedback clock signal becomes identical to the phase of the reference clock signal.

As the performance of a logic device is enhanced, the clock frequency in a central processing unit and its peripheral devices is increased. However, the clock frequency in an input/output device, a diagnostic device and others is not as high compared to the clock frequency in a central processing unit or its peripheral devices. Therefore, the distribution of a plurality of different of clock signals to one logic IC or one logic card is often required. A plurality of phase adjustment circuits described above is provided for every type of a clock in a single chip.

Referring to FIG. 4, a conventional phase adjustment circuit includes three phase-locked loop (PLL) circuits 100a to 100c, logic devices 20a-1 to 20a-n connected to PLL circuit 100a, logic devices 20b-1 to 20b-n connected to PLL circuit 100b and logic devices 20c-1 to 20c-n connected to PLL circuit 100c.

PLL circuit 100a includes a variable delay circuit 10a, a phase comparing circuit 30a and a counter 40a. Variable delay circuit 10a, to which a clock signal CK0 having a predetermined cycle is input, delays clock signal CK0 by a set delay time and outputs it. Phase comparing circuit 30a compares the phase of a feedback clock signal CFB0, which is output from the variable delay circuit 10a and delayed during internal clock distribution, and the phase of a reference clock signal CREF0 input from an external device. Counter 40a increases or decreases its counted value based on the result of the comparison by phase comparing circuit 30a. The delay time used in the variable delay circuit 10a is set based on a value counted by counter 40a.

PLL circuit 100b includes a variable delay circuit 10b, a phase comparing circuit 30b and a counter 40b. Variable delay circuit 10b, to which a clock signal CK1 having a predetermined cycle is input, delays clock signal CK1 by a set delay time and outputs it. Phase comparing circuit 30b compares the phase of a feedback clock signal CFB1, which is output from the variable delay circuit 10b and delayed during internal clock distribution, and the phase of a reference clock signal CREF1 input from an external device. Counter 40b increases or decreases its counted value based on the result of the comparison by phase comparing circuit 30b. The delay time used in the variable delay circuit 10b is set based on a value counted by counter 40b.

PLL circuit 100c includes a variable delay circuit 10c, a phase comparing circuit 30c and a counter 40c. Variable delay circuit 10c, to which a clock signal CK2 having a predetermined cycle is input, delays clock signal CK2 by a set delay time and outputs it. Phase comparing circuit 30c compares the phase of a feedback clock signal CFB2, which is output from the variable delay circuit 10c and delayed during internal clock distribution, and the phase of a reference clock signal CREF2 input from an external device. Counter 40c increases or decreases its counted value based on the result of comparison by phase comparing circuit 30c. The delay time used in the variable delay circuit 10c is set based on a value counted by counter 40c.

Clock signals CK0 to CK2 are delayed in variable delay circuits 10a to 10c, respectively, so that each phase of clock signals CFB0 to CFB2, which are delayed during clock distribution in PLL circuits 100a to 100c, become identical to each phase of reference clock signals CREF0 to CREF2, respectively. Thus, the time at which the clock signals CK0, CK1 and CK2 are supplied to logic devices 20a-1 to 20a-n, 20b-1 to 20b-n and 20c-1 to 20c-n, respectively, is adjusted.

However, it is necessary to provide the same number of PLL circuits and reference clock signal input terminals as the number of the phase adjustment circuits when a plurality of phase adjustment circuits are provided in the same chip. This creates a problem because the scale of the hardware becomes large.

While the same reference clock signal is input to the PLL circuits, it is input to the plurality of input terminals and its phase is compared to the phase of a feedback clock signal in the plurality of phase comparing circuits. This creates a problem because a slight error may be produced between the reference clock signals. The error depends on the precision of a circuit which supplies a reference clock signal and dispersion among the characteristics of the phase comparing circuits.

SUMMARY OF THE INVENTION

An object of the invention is to provide a phase adjustment circuit which adjusts the phase of a plurality of different clocks without enlarging the scale of hardware.

According to one aspect of the present invention, a phase adjustment circuit is provided which includes: a plurality of input terminals which input a plurality of clock signals, respectively; a plurality of first elements which input the clock signals, respectively, and adjust the clock signals, respectively; a second element which compares the phase of a reference clock signal and the phase of an output signal from one of the first elements and outputs a compared result; and a third element which inputs the compared result and controls each of the first elements based on the compared result.

According to another aspect of the present invention, a phase adjustment circuit is provided which includes: a plurality of input terminals which input a plurality of clock signals, respectively; a plurality of first elements which input the clock signals, respectively, and oscillate the clock signals, respectively; and a second element which compares the phase of a reference clock signal and the phase of an output signal from one of the first elements and outputs a compared result; wherein the first elements input the compared result and oscillate the clock signals, respectively, based on the compared result.

According to another aspect of the present invention, a method for adjusting the phase between a plurality of clock signals is provided which includes: delaying each of the clock signals by a delay amount; comparing the phase of a reference clock signal and the phase of one of the delayed clock signals which is delayed during the delaying step; and controlling the delay amount based on the compared result which is compared during the comparing step.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
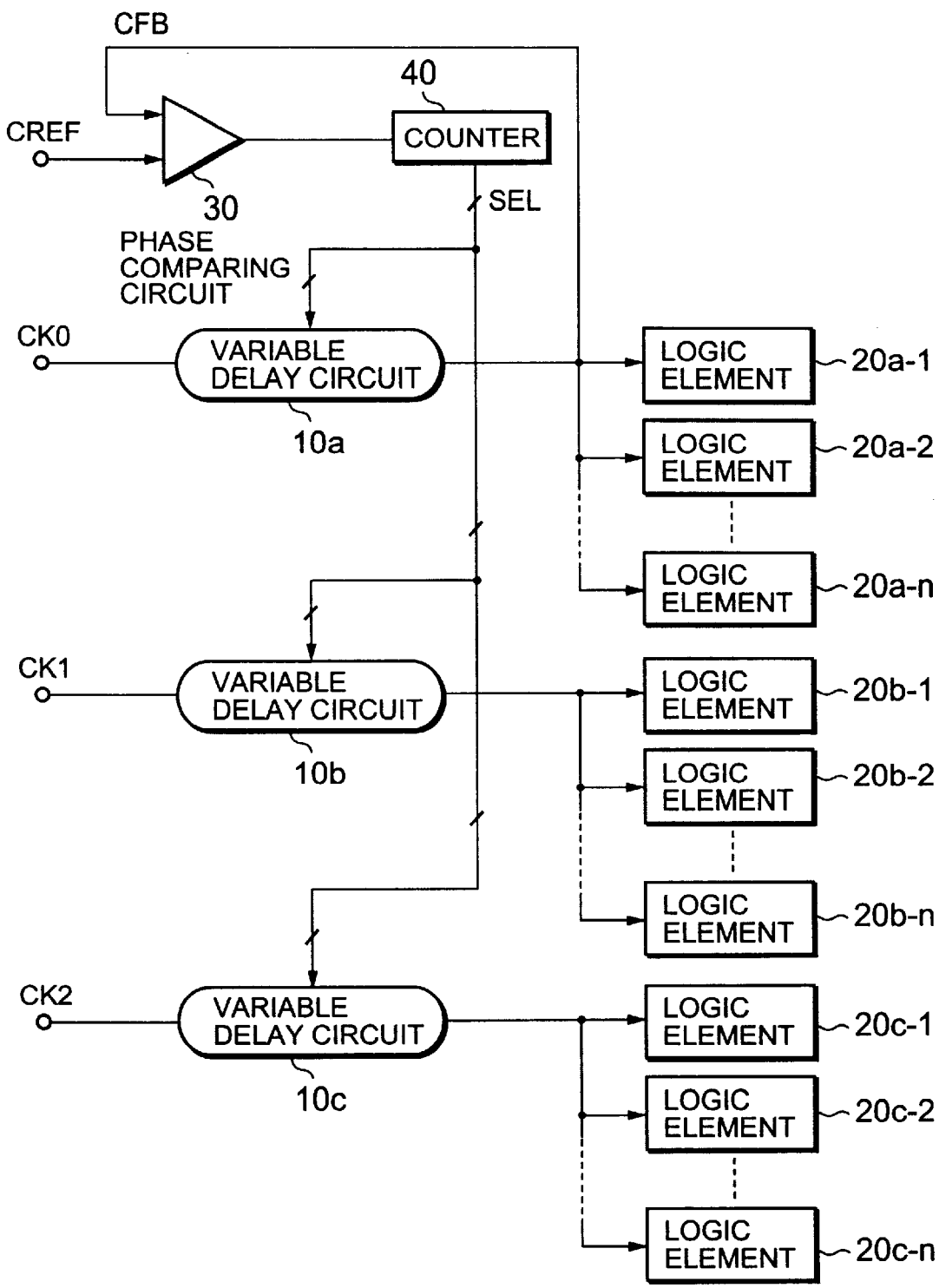
FIG. 1 is a block diagram of the first embodiment of the present invention.

Referring to FIG. 1, a phase adjustment circuit includes variable delay circuits 10a to 10c, phase comparing circuit 30, counter 40, and a plurality of logic devices 20a-1 to 20a-n, 20b-1 to 20b-n and 20c-1 to 20c-n. Variable delay circuits 10a to 10c, to which clock signals CK0 to CK2 having a cycle different from each other are respectively input, delay the clock signals CK0 to CK2 by a set delay time and outputs them. Phase comparing circuit 30 compares the phase of a feedback clock signal CFB, which is output from the variable delay circuit 10a and delayed during internal clock signal distribution, and the phase of a reference clock signal CREF, which is input from an external device. Counter 40 is used as a delay time control element which increases or decreases its counted value based on the result of the comparison by phase comparing circuit 30. Logic devices 20a-1 to 20a-n operate based on a feedback clock signal CFB output from the variable delay circuit 10a and delayed during internal clock distribution. Logic devices 20b-1 to 20b-n operate based on a clock signal output from the variable delay circuit 10b and delayed during internal clock distribution. Logic devices 20c-1 to 20c-n operate based on a clock signal output from the variable delay circuit 10c and delayed during internal clock signal distribution. Delay times in variable delay circuits 10a to 10c are set based on a value counted by counter 40.

Next, the operation of the embodiment will be described.

Clock signals CK0 to CK2, each of which has a predetermined cycle, are input to variable delay circuits 10a to 10c, respectively. Input clock signals CK0 to CK2 are delayed by a delay time set in variable delay circuits 10a to 10c, respectively.

The clock signals output from variable delay circuits 10a to 10c are delayed during clock distribution to logic devices 20a-1 to 20a-n, 20b-1 to 20b-n and 20c-1 to 20c-n. Logic devices 20a-1 to 20a-n, 20b-1 to 20b-n and 20c-1 to 20c-n operate by using the supplied clock signals.

The clock signal, which is output from the variable delay circuit 10a and delayed during clock signal distribution, is supplied to phase comparing circuit 30 as a feedback clock signal CFB as well as logic devices 20a-1 to 20a-n.

Phase comparing circuit 30 receives a reference clock signal CREF from an external device. When a feedback clock signal CFB is input to phase comparing circuit 30, phase comparing circuit 30 compares the phase of reference clock signal CREF and the phase of the feedback clock signal CFB and outputs the compared result.

Counter 40 receives the compared result from phase comparing circuit 30. If the compared result shows that the phase of feedback clock signal CFB gains in comparison with the phase of reference clock signal CREF, counter 40 increases its counted value. If the compared result shows that the phase of feedback clock signal CFB loses in comparison with the phase of reference clock signal CREF, the counter decreases its counted value. If the compared result shows that the phase of reference clock signal CREF and the phase of feedback clock signal CFB are identical, or substantially identical, the counter maintains its counted value.

The counted value output from counter 40 is input to variable delay circuits 10a to 10c. In variable delay circuits 10a to 10c, delay times, by which the phases of clock signals CK0 to CK2 are delayed, respectively, are produced and set based on the counted value.

Variable delay circuits 10a to 10c can acquire the same, or substantially the same, delay time by providing them mutually close in the same chip without being influenced by manufacturing dispersion. Therefore, the time, at which input clocks CK0 to Ck2 are respectively supplied to logic devices 20a-1 to 20a-n, 20b-1 to 20b-n and 20c-1 to 20c-n, can be adjusted by equalizing the phase of a feedback clock signal CFB with the phase of a reference clock signal CREF.

Figure 2:
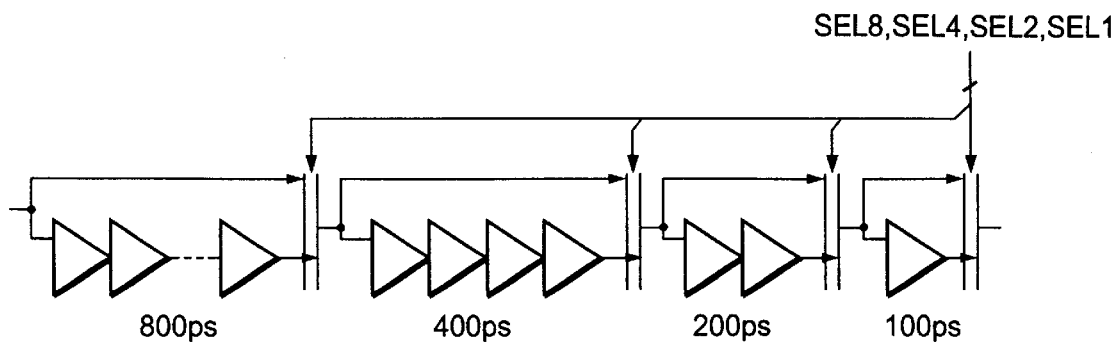
FIG. 2 is an example of the variable delay circuit.

Referring to FIG. 2, each of variable delay circuits 10a to 10c includes a plurality of delay elements. The combination of the delay elements is selected based on the counted value by counter 40 and thereby, delay time is set.

For example, if counter 40 is composed of 4 bits and a value "SEL8, SEL4, SEL2, SEL1" counted by the counter is "0, 1, 0, 1", the delay time in variable delay circuits 10a to 10c is 500 ps.

When counter 40 increases its counted value and the counted value becomes "0, 1, 1, 0", the delay time is 600 ps.

In this embodiment, counter 40 is used as a delay time control element for controlling the delay time in variable delay circuits 10a to 10c. However, any delay time control element can be used in the present invention as long as the delay times in variable delay circuits 10a to 10c are based on the comparison result by phase comparing circuit 30.

While the embodiment is addressed to a case in which three clock systems are provided, the present invention is not limited to this and can be applied to a case in which a plurality of clock systems are provided.

Next, a second embodiment of the present invention will be described in detail.

Figure 3:
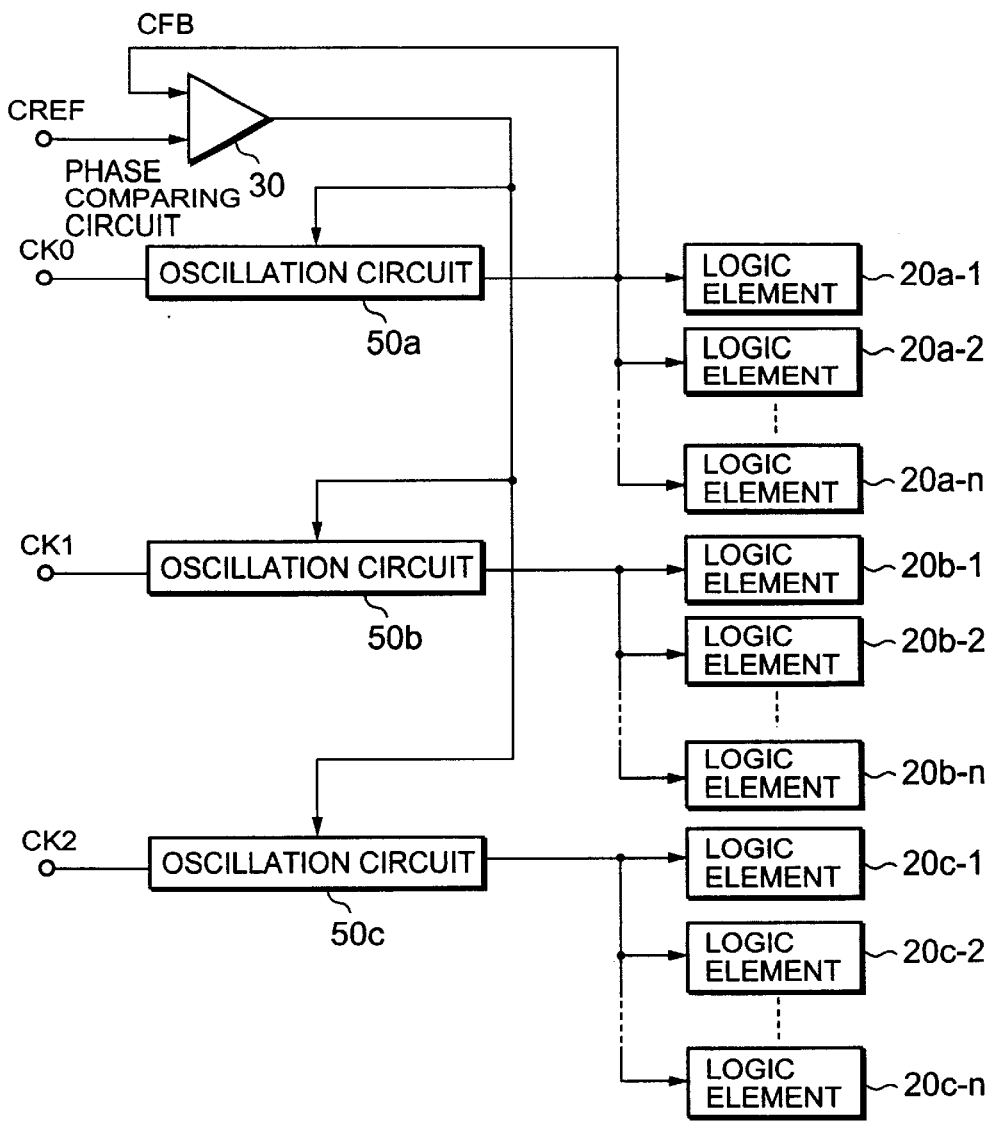
FIG. 3 is a block diagram of the second embodiment of the present invention.
Figure 4:
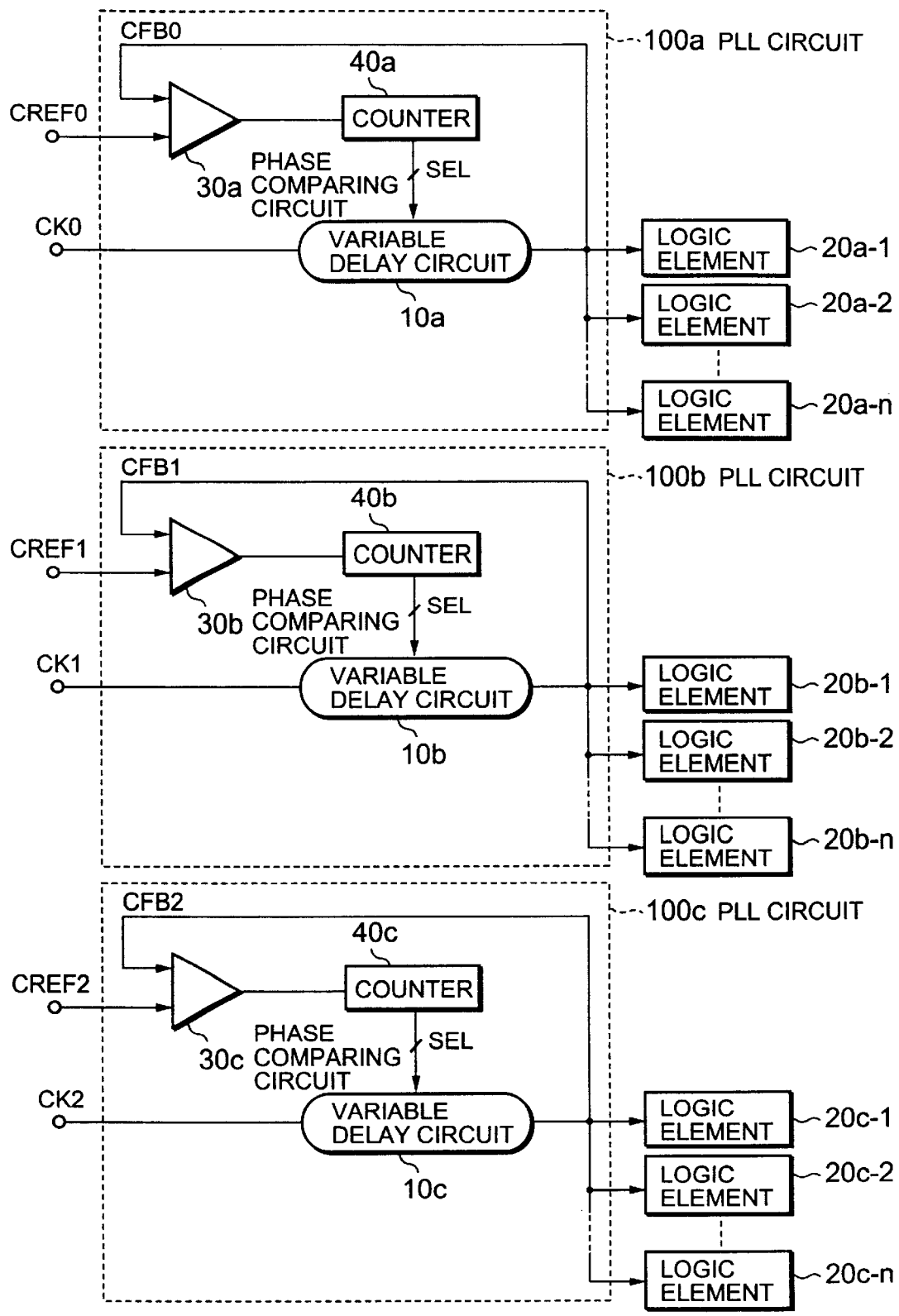
FIG. 4 is a block diagram of a conventional phase adjustment circuit.

Referring to FIG. 3, a phase adjustment circuit includes oscillation circuits 50a to 50c, phase comparing circuit 30, and logic devices 20a-1 to 20a-n, 20b-1 to 20b-n and 20c-1 to 20c-n. Oscillation circuits 50a to 50c, to which clock signals CK0 to CK2 having a predetermined cycle and a control signal are respectively input, oscillates a clock signal based on the clock signals CK0 to CK2 and the control signal. Phase comparing circuit 30 compares the phase of a feedback clock signal CFB, which is output from the oscillation circuit 50a and delayed during internal clock signal distribution, and the phase of a reference clock signal CREF input from an external device. Logic devices 20a-1 to 20a-n operate based on feedback clock signal CFB output from the oscillation circuit 50a and delayed during internal clock signal distribution. Logic devices 20b-1 to 20b-n operate based on a clock output from the oscillation circuit 50b and delayed during internal clock signal distribution. Logic devices 20c-1 to 20c-n operate based on a clock output from the oscillation circuit 50c and delayed during internal clock signal distribution. The timing of oscillation in the oscillation circuits 50a to 50c is set based on the result of the comparison by phase comparing circuit 30.

The operation of the embodiment will be described.

Clock signals CK0 to CK2, each of which has a predetermined cycle, are supplied to the oscillation circuits 50a to 50c, respectively. A control signal from phase comparing circuit 30 is input to the oscillation circuits 50a to 50c.

In each of the oscillation circuits 50a to 50c, a clock signal is oscillated based on the input clock signals CK0 to CK2 and the control signal and output.

The clock signal output from the oscillation circuits 50a to 50c are delayed during clock signal distribution to logic devices 20a-1 to 20a-n, 20b-1 to 20b-n and 20c-1 to 20c-n. Logic devices 20a-1 to 20a-n, 20b-1 to 20b-n and 20c-1 to 20c-n operate based on the supplied clock signals.

The clock signal, which is output from the oscillation circuit 50a and delayed during clock signal distribution, is supplied to phase comparing circuit 30 as a feedback clock signal CFB as well as logic devices 20a-1 to 20a-n.

Phase comparing circuit 30 receives a reference clock signal CREF from an external device. When a feedback clock signal CFB is input to phase comparing circuit 30, phase comparing circuit 30 compares the phase of reference clock signal CREF and the phase of the feedback clock signal CFB and outputs the compared result.

The compared result output from phase comparing circuit 30 is input to oscillation circuits 50a to 50c, respectively. In each of oscillation circuits 50a to 50c, a clock signal is oscillated based on clocks CK0 to CK2, which is input to the oscillation circuits, and the compared result by phase comparing circuit 30, and output.

As described above, the comparison element compares the phase of a clock signal which is output from one of the variable delay elements, which delays a clock signal input from an external device by a set delay time and outputs it, and is delayed during clock signal distribution and the phase of a reference clock signal input from an external device. The delay time control element controls the delay time in the variable delay elements based on the comparison result by the comparison element. Every delay time in the variable delay element is set by one comparison element, one delay time control element and a reference clock signal, even if the plurality of variable delay elements is used for adjusting the delay dispersion a plurality of distribution routes. Therefore, the complexity of design and an increase in chip size can be prevented. Particularly, there is no need to provide a plurality of reference clock signal input terminals. This prevents an increase in chip size.

In addition, because control is executed based on single reference clock signal, a plurality of reference clock signals are not required. Thus, an error among reference clock signals never occurs.

Because a plurality of reference clock signals are not required to be supplied, the number of wiring or cables for supplying reference clock signals can be reduced, the scale of hardware can be reduced and the occurrence of noise can be inhibited.

Further, on the circuit which supplies a reference clock signal, the complexity of design and the increase of the circuit size can be prevented.

While this invention has been described in conjunction with the preferred embodiments described above, it will now be possible for those skilled in the art to put this invention into practice in various other manners.

What is claimed is:

1. A phase adjustment circuit comprising:
   a plurality of input terminals which input a plurality of clock signals, respectively;
   a plurality of first elements which input said clock signals, respectively, and adjust said clock signals, respectively;
   a second element which compares the phase of a reference clock signal and the phase of an output signal from one of said first elements and outputs a compared result; and
   a third element which inputs said compared result and controls each of said first elements based on said compared result.

2. The phase adjustment circuit as claimed in claim 1, wherein each of said first elements delays said clock signals.

3. The phase adjustment circuit as claimed in claim 1, wherein each of said first elements has a delay amount; and
   wherein said third element sets said delay amount of each of said first elements based on said compared result.

4. The phase adjustment circuit as claimed in claim 1, wherein said third element includes a counter which increases or decreases its counted value based on said compared result.

5. The phase adjustment circuit as claimed in claim 4, wherein said counter outputs its counted value to said first elements; and
   wherein said first elements delay said clock signals based on said counted value from said third element.

6. The phase adjustment circuit as claimed in claim 1, wherein said first elements are formed close to each other in a single chip.

7. A phase adjustment circuit comprising:
   a plurality of input terminals which input a plurality of clock signals, respectively;
   a plurality of first elements which input said clock signals, respectively, and oscillate said clock signals, respectively; and
   a second element which compares the phase of a reference clock signal and the phase of an output signal from one of said first elements and outputs a compared result; and
   wherein said first elements input said compared result and oscillate said clock signals, respectively, based on said compared result.

8. A method for adjusting the phase between a plurality of clock signals, comprising:
   delaying each of said clock signals by a delay amount;
   comparing the phase of a reference clock signal and the phase of one of the delayed clock signals which is delayed during said delaying step; and
   controlling said delay amount based on the compared result which is compared during said comparing step.

9. The phase adjustment circuit as claimed in claim 8, further comprising setting said delay amount based on said compared result.

10. The phase adjustment circuit as claimed in claim 8, further comprising increasing or decreasing a counted value based on said compared result.

11. The phase adjustment circuit as claimed in claim 10, wherein said clock signals are delayed based on said counted value during said delaying step.

* * * * *